(12) United States Patent
Ma et al.

(10) Patent No.: US 10,594,283 B2
(45) Date of Patent: Mar. 17, 2020

(54) AUDIO SIGNAL LOUDNESS CONTROL

(71) Applicant: Dolby Laboratories Licensing Corporation, San Francisco, CA (US)

(72) Inventors: Guilin Ma, Beijing (CN); Xiguang Zheng, Beijing (CN)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 0 days.

(21) Appl. No.: 15/309,907

(22) PCT Filed: May 22, 2015

(86) PCT No.: PCT/US2015/032113
§ 371 (c)(1),
(2) Date: Nov. 9, 2016

(87) PCT Pub. No.: WO2015/183718
PCT Pub. Date: Dec. 3, 2015

(65) Prior Publication Data
US 2017/0222611 A1 Aug. 3, 2017

Related U.S. Application Data

(60) Provisional application No. 62/013,935, filed on Jun. 18, 2014.

(30) Foreign Application Priority Data

May 26, 2014 (CN) .......................... 2014 1 0236154

(51) Int. Cl.
*H03G 3/32* (2006.01)
*H04S 7/00* (2006.01)
*G06F 3/16* (2006.01)

(52) U.S. Cl.
CPC ............... *H03G 3/32* (2013.01); *G06F 3/165* (2013.01); *H04S 7/30* (2013.01); *H04S 2400/15* (2013.01)

(58) Field of Classification Search
CPC combination set(s) only.
See application file for complete search history.

(56) References Cited

U.S. PATENT DOCUMENTS

| 4,864,246 A | 9/1989 | Kato |
| 5,208,866 A | 5/1993 | Kato |
(Continued)

FOREIGN PATENT DOCUMENTS

| EP | 2202881 | 6/2010 |
| EP | 2395659 | 12/2011 |
(Continued)

OTHER PUBLICATIONS

Moore, B. "A Model for the Prediction of Thresholds, Loudness, and Partial Loudness" JAES vol. 45, Issue 4, pp. 224-240, Apr. 1, 1997.
(Continued)

*Primary Examiner* — Duc Nguyen
*Assistant Examiner* — Assad Mohammed (57) ABSTRACT

Example embodiments disclosed herein relate to audio signal loudness control. A method for controlling loudness of an audio signal is disclosed. The method includes responsive to determining presence of a noise signal, deriving a target partial loudness adjustment based, at least in part, on at least one of a first factor related to the noise signal and a second factor related to the audio signal. The method further includes determining a target partial loudness of the audio signal based, at least in part, on the target partial loudness adjustment. Corresponding system, apparatus and computer program product are also disclosed.

6 Claims, 3 Drawing Sheets

(56) References Cited

U.S. PATENT DOCUMENTS

| | | |
|---|---|---|
| 5,530,761 A | 6/1996 | D'Arc D'Alayer De Costemore |
| 6,078,670 A | 6/2000 | Beyer |
| 6,370,254 B1 | 4/2002 | Gore |
| 7,072,477 B1 | 7/2006 | Kincaid |
| 7,302,062 B2 | 11/2007 | Christoph |
| 7,369,906 B2 | 5/2008 | Frindle |
| 7,729,673 B2 | 6/2010 | Romesburg |
| 7,760,893 B1 | 7/2010 | Felber |
| 8,018,328 B2 | 9/2011 | Goldstein |
| 8,081,780 B2 | 12/2011 | Goldstein |
| 8,103,008 B2 | 1/2012 | Johnston |
| 8,144,881 B2 | 3/2012 | Crockett |
| 8,275,135 B2 | 9/2012 | Azizi |
| 8,306,241 B2 | 11/2012 | Kim |
| 8,315,396 B2 | 11/2012 | Schreiner |
| 8,457,321 B2 | 6/2013 | Daubigny |
| 8,488,809 B2 | 7/2013 | Seefeldt |
| 8,498,430 B2 | 7/2013 | Hess |
| 8,781,820 B2 | 7/2014 | Seguin |
| 8,903,098 B2 | 12/2014 | Tsuji |
| 8,965,774 B2 | 2/2015 | Eppolito |
| 8,989,884 B2 | 3/2015 | Guetta |
| 9,240,763 B2 | 1/2016 | Baumgarte |
| 9,294,062 B2 | 3/2016 | Hatanaka |
| 9,300,268 B2 | 3/2016 | Chen |
| 9,542,952 B2 | 1/2017 | Hatanaka |
| 9,576,585 B2 | 2/2017 | Bleidt |
| 9,608,588 B2 | 3/2017 | Baumgarte |
| 9,633,663 B2 | 4/2017 | Heuberger |
| 9,830,915 B2 | 11/2017 | Schreiner |
| 9,836,272 B2 | 12/2017 | Kono |
| 2002/0006207 A1 | 1/2002 | Matero |
| 2004/0151328 A1* | 8/2004 | Hasegawa ............... H03G 3/32 381/86 |
| 2005/0135635 A1 | 6/2005 | Prince |
| 2008/0025530 A1 | 1/2008 | Romesburg |
| 2009/0010442 A1 | 1/2009 | Usher |
| 2009/0052695 A1* | 2/2009 | Yamada ............... H03G 9/025 381/101 |
| 2010/0061566 A1* | 3/2010 | Moon ................. H03G 7/007 381/71.8 |
| 2010/0135507 A1 | 6/2010 | Kino |
| 2010/0166225 A1* | 7/2010 | Watanabe ............. H03G 3/32 381/107 |
| 2011/0095875 A1 | 4/2011 | Thyssen |
| 2011/0125489 A1* | 5/2011 | Shin ................... H03G 3/32 704/205 |
| 2011/0305346 A1* | 12/2011 | Daubigny ............. H03G 3/32 381/28 |
| 2012/0275625 A1 | 11/2012 | Kono |
| 2012/0308036 A1 | 12/2012 | Christoph |
| 2013/0094669 A1 | 4/2013 | Kono |
| 2013/0136266 A1 | 5/2013 | McClain |
| 2013/0144615 A1* | 6/2013 | Rauhala ............... G10L 25/69 704/225 |
| 2013/0279709 A1 | 10/2013 | Suzuki |
| 2014/0016791 A1 | 1/2014 | Smith |
| 2014/0314261 A1* | 10/2014 | Selig ................. H04R 25/50 381/314 |
| 2016/0225376 A1 | 8/2016 | Honma |
| 2016/0315722 A1 | 10/2016 | Holman |
| 2016/0351202 A1 | 12/2016 | Baumgarte |
| 2017/0092280 A1 | 3/2017 | Hirabayashi |
| 2017/0223429 A1 | 8/2017 | Schreiner |

FOREIGN PATENT DOCUMENTS

| | | |
|---|---|---|
| EP | 3089161 | 11/2016 |
| GB | 2292275 | 2/1996 |
| WO | 2006/047600 | 5/2006 |
| WO | 2011/131732 | 10/2011 |
| WO | 2014/111290 | 7/2014 |
| WO | 2014/160849 | 10/2014 |
| WO | 2014/160895 | 10/2014 |
| WO | 2015/059087 | 4/2015 |
| WO | 2015/088697 | 6/2015 |
| WO | 2015/144587 | 10/2015 |
| WO | 2015/148046 | 10/2015 |
| WO | 2016/075053 | 5/2016 |
| WO | 2016/193033 | 12/2016 |
| WO | 2016/202682 | 12/2016 |
| WO | 2017/023423 | 2/2017 |
| WO | 2017/023601 | 2/2017 |
| WO | 2017/058731 | 4/2017 |
| WO | 2016/002738 | 5/2017 |

OTHER PUBLICATIONS

Gockel, Hedwig et al "Asymmetry of Masking Between Complex Tones and Noise: Partial Loudness" The Journal of the Acoustical Society of America, American Institute of Physics for the Acoustical Society of America, New York, NY, US, vol. 114, No. 1, Jul. 1, 2003, pp. 349-360.

107th MPEG San Jose (CA), USA, Jan. 13-17, 2014, Meeting Report Panos Kudumakis qMedia, Queen Mary University of London https://code.soundsoftware.ac.uk/attachments/download/1094/1PanosSanJose107MPEGMeetingReport.pdf (visited Mar. 18, 2018).

108th MPEG Valencia, Spain, Mar. 31-Apr. 4, 2014, Meeting Report Panos Kudumakis qMedia, Queen Mary University of London https://code.soundsoftware.ac.uk/attachments/download/1119/1PanosValencia108MPEGMeetingReport.pdf (visited Mar. 18, 2018).

109th MPEG Sapporo, Japan, Jul. 7-11, 2014, Meeting Report Panos Kudumakis qMedia, Queen Mary University of London https://code.soundsoftware.ac.uk/attachments/download/1217/2PanosSapporo109MPEGMeetingReport.pdf (visited Mar. 19, 2018).

Baumgarte, F. et al List of Proposed Text Modifications for MPEG-D Dynamic Range Control (23003-4), ISO/IEC JTC1/SC29/WG11 MPEG2014/M34092 Jul. 2014, Sapporo, Japan.

Baumgarte, F. et al "Proposed DIS Text of 23003-4 MPEG-D DRC" ISO/IEC JTC1/SC29/WG11 MPEG4/M34091, Jul. 2014, Sapporo, Japan.

Baumgarte, F. et al "Working Draft 0 on Dynamic Range Control" ISO/IEC JTC1/SC29/WG11 MPEG4/M32271, Jan. 2014, San Jose, CA USA.

ISO/IEC JTC 1/SC 29/WG 11, "Information Technology—MPEG Audio Technologies—Part 4: Dynamic Range Control" 2014.

ISO/IEC JTC1/SC29/WG11 N15071 "White Paper on MPEG-D Dynamic Range Control" Feb. 2015, Geneva, Switzerland.

ISO/IEC WD 2300X-X:2014(E), ISO/IEC JTC 1/SC 29/WG 11, "Information Technology-MPEG Audio Technologies—Part 4: Dynamic Range Control".

Kratschmer, M. et al "External Interface to DRC Tool in MPEG-D DRC and MPEG-H" ISO/IEC JTC1/SC29/WG11 MPEG2014/M34213, Jul. 2014, Sapporo, Japan.

Kratschmer, M. et al "Proposed Text on DRC and Loudness Technology in MPEG-H 3D Audio" ISO/IEC JTC1/SC29/WG11 MPEG2014/ M33151, Mar. 2014, València, Spain.

Kratschmer, M. et al "Technical Description of a Tool for DRC Technology" ISO/IEC JTC1/SC29/WG11 MPEG2014/ M33149, Mar. 2014, Valencia, Spain.

Kuech, F. et al "Dynamic Range and Loudness Control in MPEG-H 3D Audio" presented at the 139th Convention, Oct. 29-Nov. 1, 2015, New York, USA.

Meier, M. et al "Core Experiment on Improving MPEG-D DRC Technology" ISO/IEC JTC1/SC29/WG11 MPEG2014/M33147 Mar./Apr. 2014, Valencia, Spain.

Meier, M. et al "DRC Example Bitstreams for MPEG-H" ISO/IEC JTC1/SC29/WG11 MPEG2014/M34214, Jul. 2014, Sapporo, Japan.

Neugebauer, B. et al "Core Experiment on Low-Bitrate Gain Sequence Coding for MPEG-D DRC" ISO/IEC JTC1/SC29/WG11 MPEG2014/M33145 Mar./Apr. 2014, Valencia, Spain.

Neugebauer, B. et al "Core Experiment on Redundancy Reduction in MPEG-D DRC Gain Sequence Coding" ISO/IEC JTC1/SC29/WG11 MPEG2014/M33142 Mar./Apr. 2014, Valencia, Spain.

(56) References Cited

OTHER PUBLICATIONS

Quackenbush, S. et al "Report of AhG on 3D Audio Phase, DRC and Audio Maintenance" ISO/IEC JTC1/SC29/WG11 MPEG2014/M33569, Jul. 2014, Sapporo, JP.

* cited by examiner

AUDIO SIGNAL LOUDNESS CONTROL

CROSS REFERENCE TO RELATED APPLICATIONS

This application claims priority to Chinese Patent Application No. 201410236154.0 filed 26 May 2014 and United States Provisional Application No. 62/013,935 filed 18 Jun. 2014 and entitled "Audio Signal Loudness Control" which are hereby incorporated by reference in their entirety.

TECHNOLOGY

Example embodiments disclosed herein generally relate to audio signal processing, and more specifically, to method and system for controlling loudness of an audio signal.

BACKGROUND

Figure 1:
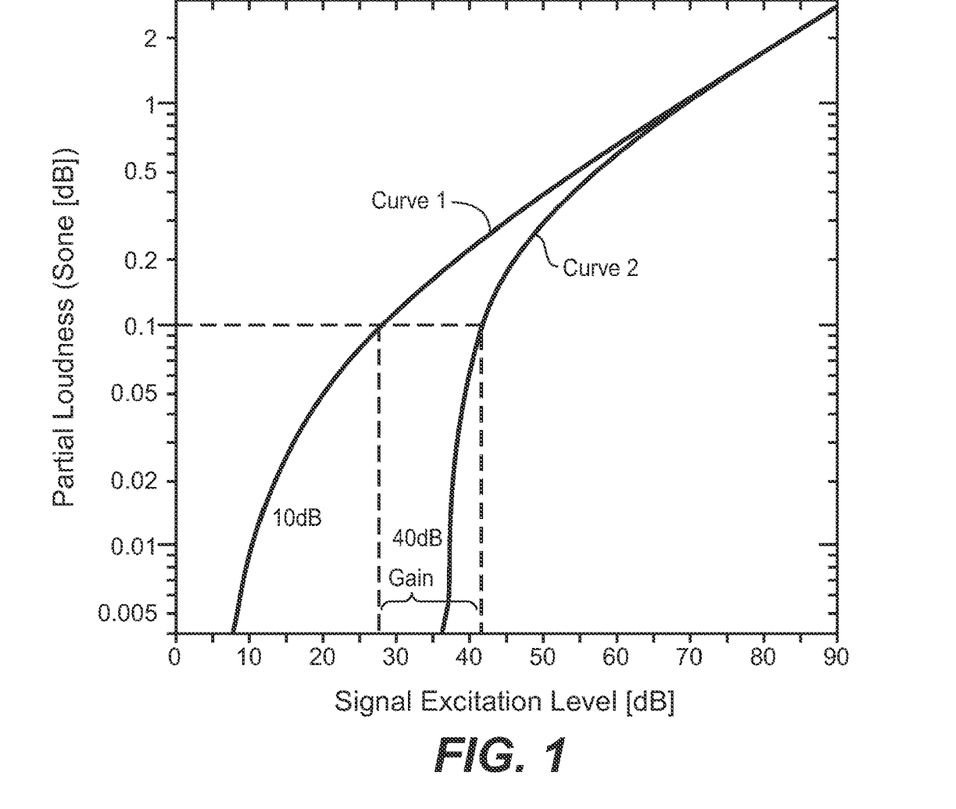
FIG. 1 illustrates a mapping function of partial loudness, noise signal level and signal excitation level in accordance with a solution of maintaining the partial loudness.

Sound loudness is a psychoacoustic correlation of the physical strength of sound. In accordance with psychoacoustic studies, when an audio of interest is heard by a headphone, an earphone or the like in presence of the background noise (competing sound), the perceived audio loudness decreases as the competing sound level increases. As used herein, the perceived loudness of an audio signal in the presence of the background noise may be referred to as "partial loudness." FIG. 1 shows the relationship between the partial loudness and the background noise. As can be seen, as the noise signal level increases from 10 dB (curve 1) to 40 dB (curve 2), the partial loudness of an audio signal with the same signal excitation level decreases. To address this problem, there are attempts to automatically control the perceived audio loudness in the presence of the competing sound, so as to avoid the audio loudness being lower or higher than a satisfied level.

For example, it has been proposed to maintain a constant partial loudness of in presence of a noise signal. In such a solution, the loudness of the audio signal in quiet conditions (in an environment free of noise signal) is derived and set as a fixed target partial loudness. In response to the presence of the noise signal as well as the change of the noise signal level, an appropriate gain for the audio signal is derived to ensure that the partial loudness of the audio signal is maintained at the fixed target partial loudness. For example, in FIG. 1, in order to maintain the same partial loudness (0.1 sone in dB) when the noise signal level increases from 10 dB (curve 1) to 40 dB (curve 2), a required gain for the audio signal is illustrated. By applying the required gain, the audio signal is maintained at a constant partial loudness under different noise signals.

It will be appreciated by those skilled in the art that when the noise signal level changes, simply maintaining the constant partial loudness usually cannot meet the user's expectation in terms of audio loudness. That is, in this event, the user would probably not be satisfied with the constant partial loudness. Therefor there is a need in the art for a solution of more flexible and satisfied audio signal loudness control.

SUMMARY

In order to address the foregoing and other potential problems, the example embodiments disclosed herein proposes a method and system for controlling loudness of an audio signal.

In one aspect, example embodiments disclosed herein provide a method for controlling loudness of an audio signal. The method includes a solution responsive to determining presence of a noise signal, deriving a target partial loudness adjustment based, at least in part, on at least one of a first factor related to the noise signal and a second factor related to the audio signal. The method further includes a step of determining a target partial loudness of the audio signal based, at least in part, on the target partial loudness adjustment. Embodiments in this regard further include a corresponding apparatus, which includes at least one processor and at least one memory including computer program code for one or more programs, the at least one memory and the computer program code configured to, with the at least one processor, cause the apparatus to perform steps of the method. Embodiments in this regard further include a corresponding computer program product.

In another aspect, example embodiments disclosed herein provide a system for controlling loudness of an audio signal. The system includes an adjustment deriving unit configured to be responsive to determining presence of a noise signal, and derive a target partial loudness adjustment based, at least in part, on at least one of a first factor related to the noise signal and a second factor related to the audio signal. The system further includes a target partial loudness determining unit configured to determine a target partial loudness of the audio signal based, at least in part, on the target partial loudness adjustment.

It has been found that the user preferred loudness (target partial loudness) of an audio signal usually changes under different noise signals, and is affected by factors related to the noise signal, the audio signal itself and/or the user. Through the following description, it would be appreciated that in accordance with example embodiments disclosed herein, the target partial loudness of the audio signal is determined by taking into account the factors related to the noise signal, the audio signal and/or the user. In this way, the target partial loudness of the audio signal is dynamically determined to adapt to the change of background noise. Other advantages achieved by example embodiments disclosed herein will become apparent through the following descriptions.

DESCRIPTION OF DRAWINGS

Through the following detailed description with reference to the accompanying drawings, the above and other objectives, features and advantages of example embodiments disclosed herein will become more comprehensible. In the drawings, several example embodiments disclosed herein will be illustrated in an example and non-limiting manner, wherein.

Throughout the drawings, the same or corresponding reference symbols refer to the same or corresponding parts.

DESCRIPTION OF EXAMPLE EMBODIMENTS

Principles of the example embodiments disclosed herein will now be described with reference to various example embodiments illustrated in the drawings. It should be appreciated that depiction of these embodiments is only to enable those skilled in the art to better understand and further implement the example embodiments, and is not intended to limit the scope of the example embodiments in any manner.

As mentioned above, maintaining a constant partial loudness under different noise signals is usually insufficient in terms of user experience. It will be appreciated by those skilled in the art that the user preference regarding loudness (target partial loudness) of an audio signal usually changes under different noise signals, and such change may be affected by factors related to the noise signal, the audio signal of interest and/or the user. For example, the user preferred loudness is shifted up when the noise signal level increases and is lowered down when the noise signal level decreases. Moreover, different audio signals with different levels and/or types as well as the user who is hearing the audio signal may lead to a different target partial loudness even at the same noise signal level. As such, example embodiments disclosed herein propose a method and system for dynamically controlling the target partial loudness of an audio signal according to factors related to the noise signal, the audio signal of interest and/or the user.

Figure 2:
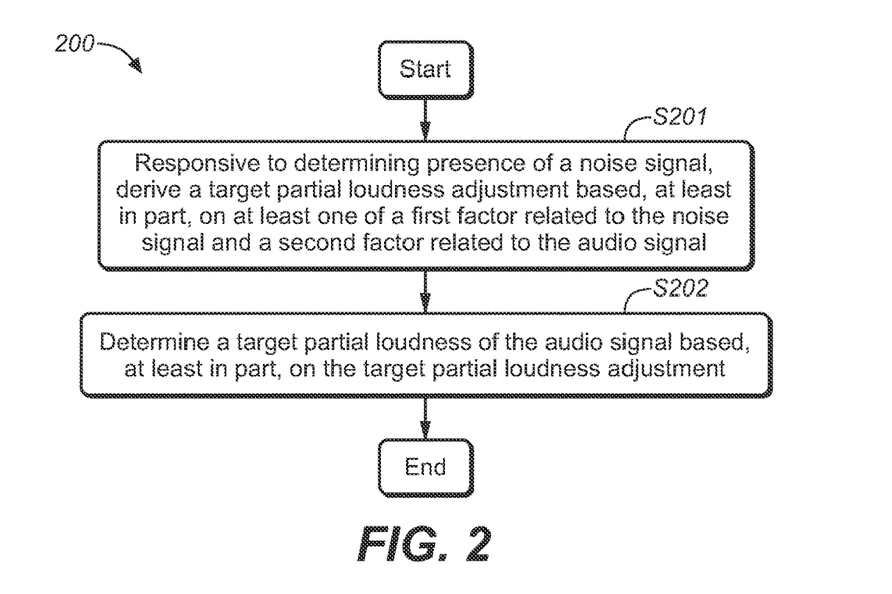
FIG. 2 illustrates a flowchart of a method for controlling loudness of an audio signal in accordance with an example embodiment.

Reference is first made to FIG. 2, where a flowchart of a method 200 for controlling loudness of an audio signal in accordance with example embodiments disclosed herein is illustrated.

At step S201, responsive to determining presence of a noise signal, a target partial loudness adjustment is derived based, at least in part, on at least one of a first factor related to the noise signal and a second factor related to the audio signal. The noise signal refers to any competing sounds interfering with the audio signal of interest. The presence of a noise signal may be detected by a microphone. As discussed above, the target partial loudness of an audio signal may be affected by the nature of the noise signal, the audio signal of interest and possibly other factors. In accordance with example embodiments disclosed herein, it is possible to derive a target partial loudness adjustment based on those factors so as to offset their impact on the target partial loudness of the audio signal.

In accordance with some example embodiments disclosed herein, the first factor may at least include at least one of a type of the noise signal and a level of the noise signal, and the second factor may at least include at least one of a type of the audio signal and a level of the audio signal. In other example embodiments disclosed herein, the first factor may also include other acoustic characteristics of the noise signal, and the second factor may also include other acoustic characteristics of the audio signal. It should be noted that these examples are only for the purpose of illustration, and the scope of the example embodiments disclosed herein are not limited in this regard.

In the following, the relationship of the target partial loudness adjustment and the type of the noise signal, the level of the noise signal, the type of the audio signal, and the level of the audio signal will be described in more details.

Type of Noise Signal

The noise signal may be classified into one of a plurality of types depending on its spectrum, autocorrelation, periodicity and other characteristics. It will be appreciated by those skilled in the art that different types of noise signals may have different impacts on the user preferred partial loudness. For example, assuming the levels of the noise signals are the same, a noise signal in a pub may have larger impact on the user preferred partial loudness than that inside an aircraft. The reason is that the noise signal inside the aircraft may mainly contain low frequency components which are less interfering with the user preferred partial loudness.

The number of the noise signal types may be determined from the fineness demand. Also, one type of the noise signal may correspond to a candidate partial loudness adjustment, which may have impact on the derived target partial loudness adjustment for the audio signal, and in turn have impact on the target partial loudness of the audio signal. For example, in one example embodiment, noise signals may be simply classified into two types, the babble noise and the pink noise, wherein the babble noise may correspond to larger candidate partial loudness adjustment than the pink noise. In some example embodiments disclosed herein, a mapping relationship between the type of the noise signal and its candidate partial loudness adjustment may be preset.

In accordance with some example embodiments disclosed herein, the type of the noise signal may be measured by a noise type classifier. The noise type classifier may receive the noise signal, and then determine the type of the noise signal by analyzing the spectrum, autocorrelation, periodicity and other characteristics of the noise signal. In addition, a more advanced noise type classifier may also be used to estimate the environment information of the user, for example information about whether the user is in a train station, on the street or in a pub. The type of the noise signal may be determined depending on an analysis result of the noise type classifier, and the corresponding candidate partial loudness adjustment of the type of the noise signal may be determined depending on the preset mapping relationship.

Level of Noise Signal

It will be appreciated by those skilled in the art that the user preferred partial loudness of the audio signal may increase along with the level of the noise signal increases. Accordingly, in some example embodiments, a mapping relationship between the level of the noise signal and its candidate partial loudness adjustment may be preset. In one example embodiment, the level of the noise signal in a certain range may correspond to one candidate partial loudness adjustment. In another example embedment, a specific level of the noise signal may correspond to one candidate partial loudness adjustment. The example embodiments disclosed herein are not limited in this regard.

In accordance with some example embodiments disclosed herein, the level of the noise signal may be measured by a noise level meter. The level of the noise signal may be, for example, in units of dB SPL, or in units of dB. The noise signal may be captured by a microphone and then may be measured by the noise level meter. In accordance with example embodiments disclosed herein, in order to control the partial loudness (perceived loudness) of the audio signal in presence of the noise signal, the level of the noise signal may be the noise loudness perceived by the user. In some conditions, the user may hear the audio signal via audio supply equipment such as an earphone, a headphone and so on. In such conditions, loudness of the background noise that is perceived by the user may be lower than the actual loudness of the background noise due to blocking effect of the audio supply equipment on the user's ears. As such, such blocking effect of the audio supply equipment may also be taken into account, and the level of the noise signal may be determined as the user perceived noise level.

Type of Audio Signal

It will be appreciated by those skilled in the art that different audio signal types may as well have different impacts on the user preferred partial loudness (target partial loudness). For example, a softer music audio may require less target partial loudness, while a music audio such as rock music may require higher target partial loudness. For a movie, the required target partial loudness may be usually higher than music audio as the dialog of the movie is desired to be loud enough to avoid listening fatigues.

In accordance with some example embodiments disclosed herein, the types of the audio signals may be classified by an audio type classifier, for example, based on media intelligence techniques. The types of audio signals may include, for example, music, speech, movie, sports events and the like. In some other examples, the types of audio signals may be classified more finely. By way of example, the type of music may be further classified into blue music, rock music, and so on. The scope of the example embodiments disclosed herein are not limited in this regard.

Level of Audio Signal

It would be appreciated that the levels of different audio signals may be different. It will be appreciated by those skilled in the art that when the background noise level becomes higher, for an audio signal with lower levels, larger candidate partial loudness adjustment is needed to make the target partial loudness adjustment larger and in turn make the target partial loudness of the audio signal larger, while an audio signal with higher level may correspond to a smaller candidate partial loudness adjustment.

In the example embodiments as discussed above, the target partial loudness of the audio signal is determined based on acoustic factors. However, some non-acoustic factors such as factors related to the user hearing the audio signal may also have impact on the target partial loudness of the audio signal. In accordance with further example embodiments disclosed herein, the deriving of the target partial loudness adjustment at step S201 may be further based, at least in part, on a third factor related to a user, the third factor at least including at least one of personal information and preference of the user. The personal information of the user may include, for example, the user's gender, age and so on. The preference of the user may be the audio signal loudness that is preferred. For example, the user may prefer a softer or louder output audio signal. The personal information and preference of the user may be obtained by user inputs. Alternatively or additionally, the personal information and preference of the user may be automatically learned, for example, by recording the user preferred loudness when the user is hearing the audio. The third factor may further include visual and other human sensory inputs. One or more of those factors may correspond to one or more candidate partial loudness adjustments.

As discussed in the above, the first, second and third factors may be used, either alone or in any combination, to derive the target partial loudness adjustment. Therefore, any one or a combination of two or more of the above mentioned factors may be used to determine the target partial loudness adjustment. The scope of the example embodiments disclosed herein are not limited in this regard.

As discussed in the above, each of factors being considered to derive the target partial loudness adjustment, including the type and level of the noise signal, the type and level of the audio signal, as well as the factors related to the user, may have a corresponding candidate partial loudness adjustment. In accordance with some example embodiments disclosed herein, the step, technique or procedure of deriving the target partial loudness adjustment may include determining a candidate partial loudness adjustment corresponding to each of at least one of the first, second and third factors; and determining the target partial loudness adjustment by combining the candidate partial loudness adjustments according to a weight associated with each of the at least one of the first, second and third factors. The weight associated with each factor being considered may be determined based on its impact on the target partial loudness of the audio signal. In some example embodiments, the target partial loudness adjustment may be derived, for example, by the following formula:

$$\Delta L_F = \sum_{i=1}^{n} \alpha_i L_i \tag{1}$$

Where $\Delta L_F$ represents the target partial loudness adjustment; n represents the number of factors being considered; $\alpha_i$ represents the weight of the ith factor being considered and $L_i$ represents the candidate partial loudness adjustment of the ith factor being considered.

In other embodiments, any other suitable method or algorithm for determining the target partial loudness adjustments based on at least one of the first, second and third factors may be used. The scope of the example embodiments is not limited in this regard.

In some other example embodiments disclosed herein, two or more factors being considered may correspond to one candidate partial loudness adjustment. For example, a specific type and a specific level of the audio signal may correspond to one candidate partial loudness adjustment. In such cases, the target partial loudness adjustment may be derived similarly as the above.

After the target partial loudness adjustment is derived, the method 200 then proceeds to step S202, where a target partial loudness of the audio signal is determined based, at least in part, on the target partial loudness adjustment.

The target partial loudness adjustment derived at step S201 based on the factor(s) being considered, such as acoustic factors (the first and second factors) and non-acoustic factors (the third factor), may be used to offset the partial loudness of the audio signal in a noise environment.

As used herein, the target partial loudness is the perceived loudness of an audio signal that is determined for the user when the audio signal is heard in the presence of a noise signal. Usually, the partial loudness may not be exactly equal to the audio signal excitation level, and the relationship between these two may be different at different noise signal levels and may be determined by certain mapping functions.

In accordance with some example embodiments disclosed herein, determining the target partial loudness of the audio signal based, at least in part, on the target partial loudness adjustment may comprise: determining a reference partial loudness of the audio signal; and determining the target partial loudness of the audio signal from the reference partial loudness and the target partial loudness adjustment.

In these embodiments, the reference partial loudness of the audio signal may be used as a basis for determining the target partial loudness. The reference partial loudness may be predetermined and may be usually constant. In one example embodiment, the reference partial loudness may be predetermined as the initial perceived loudness of the audio signal in a quiet environment without noise signals. In other example embodiments, the reference partial loudness may be the perceived loudness of the audio signal in presence of any background noise. For example, the reference partial loudness may be the perceived audio loudness in presence of a high level of noise signal, or in presence of a low level of noise signal. In any case where the reference partial loudness is predetermined, simply maintaining the perceived loudness (target partial loudness) of the audio signal at this reference partial loudness when the background noise signal changes may not be desired by the user. Rather, the perceived loudness may be adjusted by combining the target partial loudness adjustment derived based on the factors related to the noise signal, the audio signal and the user, with the reference partial loudness.

It should be noted that the determined target partial loudness adjustment may not always be positive or negative, and the scope of the example embodiments disclosed herein are not limited in this aspect. For example, in a case where the reference partial loudness is the perceived audio loudness in presence of a high level of noise signal, when the noise level decreases, the reference partial loudness may be too loud in this environment, and thus the target partial loudness adjustment determined as above may be negative so as to reduce the reference partial loudness by an appropriate adjustment.

By way of example, the target partial loudness of the audio signal may be represented by the following formula:

$$L_F = L_o + \Delta L_F \quad (2)$$

Where $L_F$ represents the target partial loudness of the audio signal; $L_o$ represents the reference partial loudness of the audio signal; and $\Delta L_F$ represents the derived target partial loudness adjustment, which may be a positive or negative value. In this way, it is possible to better offset the effect of the noise signal to the partial loudness and improve the user experience in terms of audio loudness.

Figure 3:
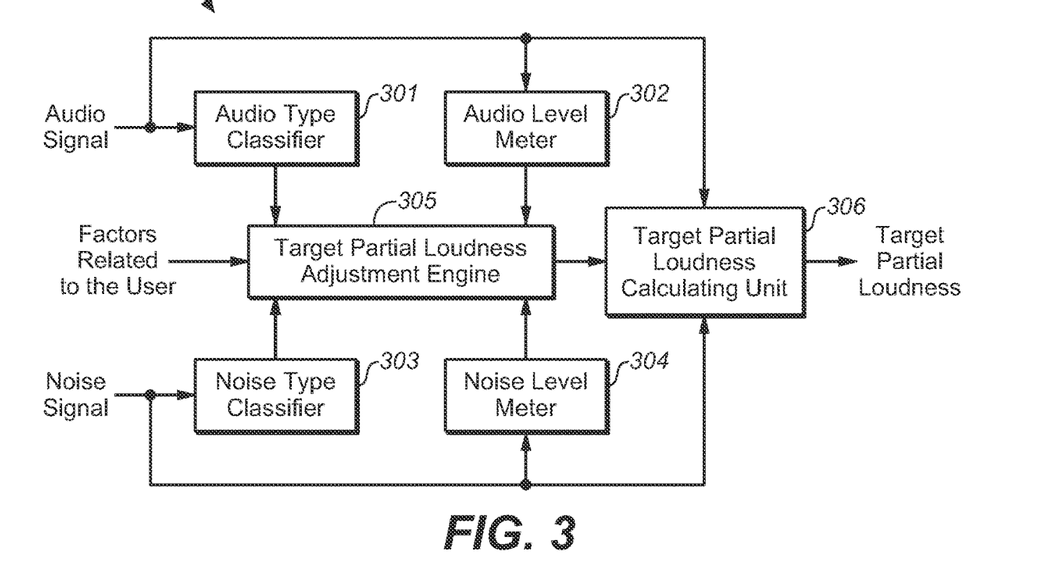
FIG. 3 illustrates an example system architecture for deriving the target partial loudness of the audio signal in accordance with an example embodiment.

Referring to FIG. 3, an example system architecture 300 for determining the target partial loudness is shown. As illustrated in FIG. 3, the audio signal is measured by an audio type classifier 301 to determine the type of the audio signal, and measured by an audio level meter 302 to determine the level of the audio signal. The noise signal is measured by a noise type classifier 303 to determine the type of the noise signal, and measured by a noise level meter 304 to determine the level of the noise signal. The results are all transmitted to the target partial loudness adjustment engine 305, as well as factors related to the user (if needed), to derive the target partial loudness adjustment. In FIG. 3, the audio signal and the noise signal are also transmitted to the target partial loudness calculating unit 306 to determine the reference partial loudness of the audio signal. Moreover, the derived target partial loudness adjustment in the target partial loudness adjustment engine 305 is input into the target partial loudness calculating unit 306 for determining the target partial loudness on the basis on the reference partial loudness of the audio signal.

It should be noted that one or more of the blocks shown in FIG. 3 may be optional and thus can be omitted in some embodiments. For example, if only the types of the noise signal and of the audio signal are used to derive the target partial loudness adjustment, then the noise level meter and the audio level meter illustrated in FIG. 3 can be omitted. It is understood as well that even if some factors may not be considered to derive the target partial loudness adjustment, their corresponding blocks may also exist in the system. For example, even if the levels of the noise signal and audio signal are not considered to derive the target partial loudness adjustment, the noise level meter and the audio level meter may exist in the system but will not transmit inputs to the target partial loudness adjustment engine 305.

According to example embodiments disclosed herein, with different background noises, different target partial loudness adjustments may be derived based on different noise signals, audio signals and factors related to the user. As such, the target partial loudness may be dynamically modified to different levels, so as to render the audio signal more clear and comfortable for the user.

Figure 4:
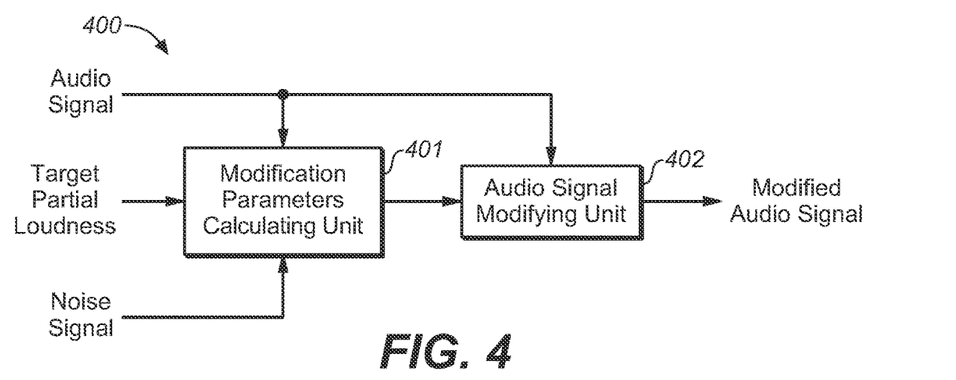
FIG. 4 illustrates an example system architecture for modifying the audio signal based on the target partial loudness of FIG. 3 in accordance with an example embodiment.

In accordance with further example embodiments disclosed herein, the determined target partial loudness may be applied to the audio signal. The level of audio signal may be modified to this target partial loudness (perceived loudness). In this regard, any known or future developed techniques may be used for modifying the audio signal to a specific partial loudness. For example, in the example system architecture 400 illustrated in FIG. 4, the modification parameters calculating unit 401 may calculate modification parameters for the audio signal based on the target partial loudness determined in FIG. 3, the audio signal and the noise signal, and transmit the calculated modification parameters to the audio signal modifying unit 402. The audio signal modifying unit 402 may modify the audio signal based on the modification parameters and then output the modified audio signal. The modified audio signal may have the target partial loudness.

Figure 5:
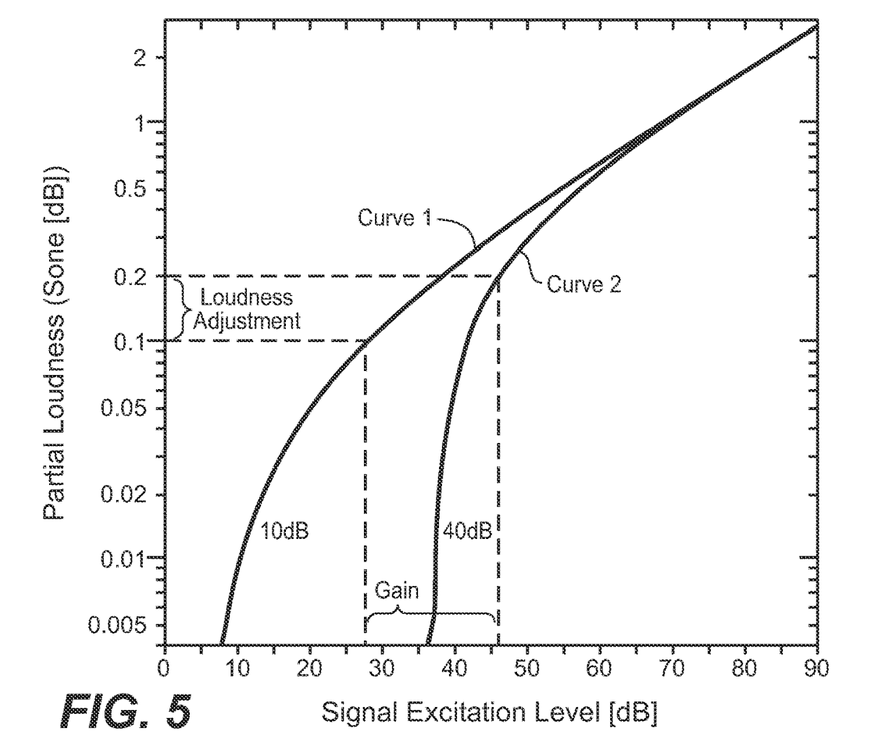
FIG. 5 illustrates a mapping function of partial loudness, noise signal level and signal excitation level in accordance with an example embodiment.

FIG. 5 depicts different audio signals corresponding to different target partial loudness and different signal excitation levels in accordance with an example embodiment. As illustrated in FIG. 5, if the level of the noise signal is 10 dB (curve 1), the target partial loudness of the audio signal is determined as 0.1 sone in dB, while if the level of the noise signal is 40 dB (curve 2), the target partial loudness of the audio signal is determined as 0.2 sone in dB. As such, the gain needed for the signal excitation level (signal energy) of the audio signal is shown as in FIG. 5 if the level of the noise signal increases from 10 dB to 40 dB.

According to further example embodiments disclosed herein, different target partial loudness adjustments of the audio signal in different frequency bands may be derived, so as to determine the target partial loudness for the audio signal with respect to different frequency bands.

As the audio signal usually changes with the time and the noise signal may also change, the target partial loudness adjustment may be derived continually. In some embodiments, the target partial loudness adjustment may be derived periodically and accordingly the target partial loudness of the audio signal may be determined. In other embodiments, deriving of the target partial loudness adjustment may be triggered by an event, for example, when the type or level of the noise signal changes, when the type or level of the audio signal changes, or when the user changes.

In the cases where the target partial loudness adjustment changes significantly, the target partial loudness of the audio signal may have a sudden change, which may have impact on the listening experience of the user. As such, in further example embodiments disclosed herein, the target partial loudness is smoothed for applying to the audio signal. That is, if the difference between the target partial loudness to be applied and the current target partial loudness of the audio signal is large, for example, than a predetermined threshold, the target partial loudness to be applied may be smoothed to be lower or larger, for example, to reduce its difference with the current target partial loudness of the audio signal by a little amount. In this way, potential sudden change of the loudness of the audio signal may be avoided. In other examples, the audio signal loudness may be slowly increased or decreased to the target partial loudness to be applied to avoid sudden change of the loudness of the audio signal.

As discussed above, the mapping relationship of various factors, including the type or level of the noise signal, the type or level of the audio signal and factors related to the user, and their respective candidate partial loudness adjustment may be preset. In addition, the factors being considered for deriving the target partial loudness adjustment may have respective weights. In some example embodiments disclosed herein, a specific candidate partial loudness adjustment and weight of each factor may be obtained using an empirical method. For example, the specific candidate partial loudness adjustment and weight of each factor may be determined through psychoacoustic experiments that investigate user preferred partial loudness under different conditions (different types or levels of the noise signal, different types or levels of the audio signal, or factors related to the user and the like). In other example embodiments disclosed herein, behavior of the user may be detected after the target partial loudness is applied to the audio signal. In such embodiments, at least one of the candidate partial loudness adjustments and the weights may be modified based on the detected behavior of the user. For example, a preset weight and candidate partial loudness adjustment of the babble noise may be used to determine the target partial loudness adjustment and in turn determine the target partial loudness of the audio signal. Then, if it has been found that the user may continue increasing the loudness of the audio signal for the babble noise, it may be determined that the preset weight and/or candidate partial loudness adjustment for the babble noise is insufficient, and the weight and/or candidate partial loudness adjustment of the babble noise may be increased accordingly. For other factors, such as the level of the noise signal, the type and level of the audio signal, and the personal information and preference of the user, similar methods may be used to adaptively modify their weight and/or candidate partial loudness adjustment, so as to make the determined target partial loudness of the audio signal based on these factors more satisfied.

Figure 6:
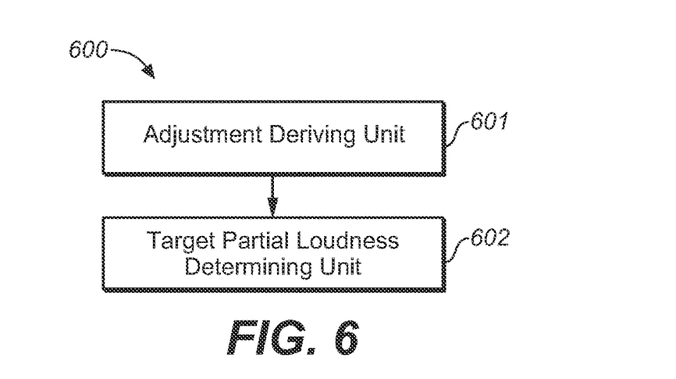
FIG. 6 illustrates a block diagram of a system for controlling loudness of an audio signal in accordance with an example embodiment.

FIG. 6 shows a block diagram of a system 600 for controlling loudness of an audio signal in accordance with one example embodiment. As shown, the system 600 comprises an adjustment deriving unit 601 configured to be responsive to determining the presence of a noise signal, and deriving a target partial loudness adjustment based, at least in part, on at least one of a first factor related to the noise signal and a second factor related to the audio signal. The system 600 also comprises a target partial loudness determining unit 602 configured to determine a target partial loudness of the audio signal based, at least in part, on the target partial loudness adjustment.

In some embodiments, the first factor at least may include at least one of a type of the noise signal and a level of the noise signal, and the second factor at least may include at least one of a type of the audio signal and a level of the audio signal.

In some further embodiments, the deriving of the target partial loudness adjustment may be further based, at least in part, on a third factor related to a user, the third factor at least including at least one of personal information and preferences of the user.

In some embodiments, the adjustment deriving unit 601 may comprise an individual adjustment determining unit configured to determine a candidate partial loudness adjustment corresponding to each of at least one of the first, second and third factors; and an adjustment combination unit configured to determine the target partial loudness adjustment by combining the candidate partial loudness adjustments according to a weight associated with each of the at least one of the first, second and third factors.

In some embodiments, the target partial loudness determining unit 602 may comprise a reference partial loudness determining unit configured to determine a reference partial loudness of the audio signal, wherein the target partial loudness determining unit 602 may be configured to determine the target partial loudness of the audio signal from the reference partial loudness and the target partial loudness adjustment.

In some embodiments, the system 600 may further comprise a smoothing processing unit configured to smooth the target partial loudness for applying to the audio signal.

In some embodiment, the system 600 may further comprise a behavior detecting unit configured to detect behavior of the user after the target partial loudness is applied to the audio signal; and an adaptive modifying unit configured to modify at least one of the candidate partial loudness adjustments and the weights based on the behavior of the user.

For the sake of clarity, some optional components of the system 600 are not shown in FIG. 6. However, it should be appreciated that the features as described above with reference to FIGS. 2-5 are all applicable to the system 600. Moreover, the components of the system 600 may be a hardware module or a software unit module. For example, in some embodiments, the system 600 may be implemented partially or completely with software and/or firmware, for example, implemented as a computer program product embodied in a computer readable medium. Alternatively or additionally, the system 600 may be implemented partially or completely based on hardware, for example, as an integrated circuit (IC), an application-specific integrated circuit (ASIC), a system on chip (SOC), a field programmable gate array (FPGA), and so forth. The scope of the example embodiment is not limited in this regard.

Example embodiments disclosed herein further provide an apparatus, comprising at least one processor; and at least one memory including computer program code for one or more programs, the at least one memory and the computer program code configured to, with the at least one processor, cause the apparatus to perform steps of the method as described above.

Figure 7:
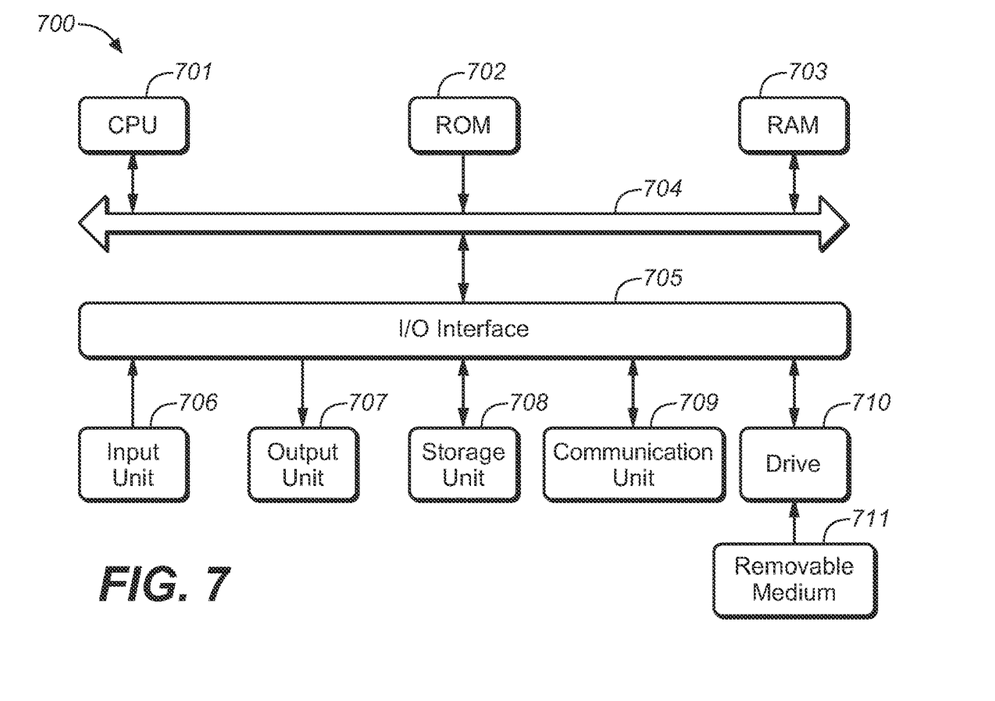
FIG. 7 illustrates a block diagram of an example computer system suitable for implementing example embodiments disclosed herein.

FIG. 7 illustrates a block diagram of an example computer system 700 suitable for implementing example embodiments disclosed herein. As shown, the computer system 700 comprises a central processing unit (CPU) 701 which is capable of performing various processes in accordance with a program stored in a read only memory (ROM) 702 or a program loaded from a storage section 708 to a random access memory (RAM) 703. In the RAM 703, data required when the CPU 701 performs the various processes or the like is also stored as required. The CPU 701, the ROM 702 and the RAM 703 are connected to one another via a bus 704. An input/output (I/O) interface 705 is also connected to the bus 704.

The following components are connected to the I/O interface 705: an input section 706 including a keyboard, a mouse, or the like; an output section 707 including a display such as a cathode ray tube (CRT), a liquid crystal display (LCD), or the like, and a loudspeaker or the like; the storage section 708 including a hard disk or the like; and a communication section 709 including a network interface card such as a LAN card, a modem, or the like. The communication section 709 performs a communication process via the network such as the internet. A drive 710 is also connected to the I/O interface 705 as required. A removable medium 711, such as a magnetic disk, an optical disk, a magneto-optical disk, a semiconductor memory, or the like, is mounted on the drive 710 as required, so that a computer program read therefrom is installed into the storage section 708 as required.

Specifically, in accordance with example embodiments disclosed herein, the processes described above with reference to FIGS. 2-6 may be implemented as computer software programs. For example, example embodiments disclosed herein comprise a computer program product including a computer program tangibly embodied on a machine readable medium, the computer program including program code for performing method 200. In such embodiments, the computer program may be downloaded and mounted from the network via the communication section 709, and/or installed from the removable medium 711.

Generally speaking, various example embodiments disclosed herein may be implemented in hardware or special purpose circuits, software, logic or any combination thereof. Some aspects may be implemented in hardware, while other aspects may be implemented in firmware or software which may be executed by a controller, microprocessor or other computing device. While various aspects of the example example embodiments disclosed herein are illustrated and described as block diagrams, flowcharts, or using some other pictorial representation, it will be appreciated that the blocks, apparatus, systems, techniques or methods described herein may be implemented in, as non-limiting examples, hardware, software, firmware, special purpose circuits or logic, general purpose hardware or controller or other computing devices, or some combination thereof.

Additionally, various blocks shown in the flowcharts may be viewed as method steps, and/or as operations that result from operation of computer program code, and/or as a plurality of coupled logic circuit elements constructed to carry out the associated function(s). For example, example embodiments disclosed herein include a computer program product comprising a computer program tangibly embodied on a machine readable medium, the computer program containing program codes configured to carry out the methods as described above.

In the context of the disclosure, a machine readable medium may be any tangible medium that can contain, or store a program for use by or in connection with an instruction execution system, apparatus, or device. The machine readable medium may be a machine readable signal medium or a machine readable storage medium. A machine readable medium may include but not limited to an electronic, magnetic, optical, electromagnetic, infrared, or semiconductor system, apparatus, or device, or any suitable combination of the foregoing. More specific examples of the machine readable storage medium would include an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing.

Computer program code for carrying out methods of the example embodiments may be written in any combination of one or more programming languages. These computer program codes may be provided to a processor of a general purpose computer, special purpose computer, or other programmable data processing apparatus, such that the program codes, when executed by the processor of the computer or other programmable data processing apparatus, cause the functions/operations specified in the flowcharts and/or block diagrams to be implemented. The program code may execute entirely on a computer, partly on the computer, as a stand-alone software package, partly on the computer and partly on a remote computer or entirely on the remote computer or server and/or distributed across one or more remote computer or servers.

Further, while operations are depicted in a particular order, this should not be understood as requiring that such operations be performed in the particular order shown or in sequential order, or that all illustrated operations be performed, to achieve desirable results. In certain circumstances, multitasking and parallel processing may be advantageous. Likewise, while several specific implementation details are contained in the above discussions, these should not be construed as limitations on the scope of any example embodiments or of what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable subcombination.

Various modifications, adaptations to the foregoing example embodiments may become apparent to those skilled in the relevant arts in view of the foregoing description, when read in conjunction with the accompanying drawings. Any and all modifications will still fall within the scope of the non-limiting and example embodiments. Furthermore, other example embodiments set forth herein will come to mind to one skilled in the art to which these embodiments pertain having the benefit of the teachings presented in the foregoing descriptions and the drawings.

Accordingly, the example embodiments may be embodied in any of the forms described herein. For example, the following enumerated example embodiments (EEEs) describe some structures, features, and functionalities of some aspects of the example embodiments.

EEE 1. A method for dynamic audio loudness control in presence of competing noise signal where the preferred target loudness is dynamically derived based on multiple related acoustic and/or non-acoustic factors.

EEE 2. The method as recited in EEE 1, wherein the acoustic factors include but not limited to signal level, signal type, and etc.

EEE 3. The method as recited in EEE 1, wherein the acoustic factors include the acoustic characteristics of the audio signal of interest and the competing noise signal.

EEE 4. The method as recited in EEE 1, wherein the non-acoustic factors include but not limited to gender, age, and individual preferences, and etc.

EEE 5. The method as recited in EEE 1, wherein the non-acoustic factors also include other human sensory inputs such as visual cues.

EEE 6. The method as recited in EEE 1, wherein the relationship between the considered factors and the target loudness can be obtained by empirical psychoacoustic studies and/or adaptive learning algorithms where the users' selection of the preferred loudness is recorded and adaptively learned.

EEE 7. The method as recited in EEE 1, wherein the calculated loudness adjustment may be smoothed to avoid sudden loudness change for the output audio signal.

It will be appreciated that the example embodiments disclosed herein are not to be limited to the specific embodiments disclosed and that modifications and other embodiments are intended to be included within the scope of the appended claims. Although specific terms are used herein, they are used in a generic and descriptive sense only and not for purposes of limitation.

What is claimed is:

1. A method for controlling loudness of an audio signal, comprising:
    at a first time:
        deriving a first target partial loudness adjustment based, at least in part, on a first factor indicating a first frequency band of the audio signal, and a second factor related to a level of the audio signal;
        determining a first target partial loudness from the first target partial loudness adjustment and a reference partial loudness;
        adjusting a loudness of the audio signal using the first target partial loudness;
    at a second time after the first time:
        deriving a second target partial loudness adjustment based, at least in part, on the first factor indicating a second frequency band of the audio signal and the second factor related to the level of the audio signal, where the second frequency band is different than the first frequency band;
        determining a second target partial loudness from the second target partial loudness adjustment and the reference partial loudness; and
        adjusting the loudness of the audio signal using the second target partial loudness.

2. The method according to claim 1, further comprising: smoothing the first or second target partial loudness before using the first or second target partial loudness adjust the audio signal.

3. A system for controlling loudness of an audio signal, comprising:
    an adjustment deriving unit configured to:
        derive, at a first time, a first target partial loudness adjustment based, at least in part, on a first factor indicating a first frequency band of the audio signal and a second factor related to a level of the audio signal; and
        derive, at a second time after the first time, a second target partial loudness adjustment based, at least in part, on the first factor indicating a second frequency band of the audio signal and the second factor related to the level of the audio signal, where the second frequency band is different than the first frequency band;
    a target partial loudness determining unit configured to:
        determine, at the first time, a first target partial loudness from the first target partial loudness adjustment and a reference partial loudness;
        adjust, at the first time, a loudness of the audio signal using the first target partial loudness;
        determine, at the second time, the second target partial loudness of the audio signal from the second target partial loudness adjustment and the reference partial loudness; and
        adjust, at the second time, the loudness of the audio signal using the second target partial loudness.

4. The system according to claim 3, further comprising: a smoothing processing unit configured to smooth the first or second target partial loudness before using the first or second target partial loudness to adjust the audio signal.

5. An apparatus for audio signal loudness control, comprising:
    at least one processor; and
    at least one memory including computer program code for one or more programs,
the at least one memory and the computer program code configured to, with the at least one processor, cause the apparatus to perform steps of the method according to claim 1.

6. A computer program product for audio signal loudness control, the computer program product being tangibly stored on a non-transient computer-readable medium and comprising machine executable instructions which, when executed, cause the machine to perform steps of the method according to claim 1.

* * * * *